(12) United States Patent
Chung

(10) Patent No.: US 7,446,590 B2
(45) Date of Patent: Nov. 4, 2008

(54) LOW NOISE MIXER WITH REDUCED DISTORTION

(75) Inventor: Yuan-hung Chung, Jhudong Township (TW)

(73) Assignee: MEDIATEK Inc., Hsin-Chu (TW)

( * ) Notice: Subject to any disclaimer, the term of this patent is extended or adjusted under 35 U.S.C. 154(b) by 35 days.

(21) Appl. No.: 11/531,400

(22) Filed: Sep. 13, 2006

(65) Prior Publication Data

US 2008/0061859 A1    Mar. 13, 2008

(51) Int. Cl.
 *H04B 1/28* (2006.01)
(52) U.S. Cl. .................. 327/355; 327/357; 455/326; 455/333
(58) Field of Classification Search ......... 327/355–359; 455/326, 333
See application file for complete search history.

(56) References Cited

U.S. PATENT DOCUMENTS

| 5,532,637 | A | 7/1996 | Khoury et al. |
| 6,026,286 | A | 2/2000 | Long |
| 6,057,714 | A * | 5/2000 | Andrys et al. ............... 327/105 |
| 6,922,108 | B2 * | 7/2005 | Lin ............................. 330/301 |

OTHER PUBLICATIONS

Massimo Brandolini, Paolo Rossi, Davide Sanzogni, "A CMOS Direct Down-Converter with +78dBm Minimum IIP2 for 3G Cell-Phones" in IEEE ISSCC Digest of Technical Papers, Feb. 2005, pp. 320-321, 601.

Danilo Manstretta, Massimo Brandolini, Franceso Svelto, "Second-Order Intermodulation Mechanisms in CMOS Downconverters" in IEEE Journal of Solid-State Circuits, Mar. 2003, pp. 394-406, vol. 38, No. 3.

* cited by examiner

*Primary Examiner*—Dinh T. Le

(57) ABSTRACT

A low noise RF mixer is described. The mixer of the present invention has excellent linearity due to reduction of second-order distortion. The mixer includes an inputting stage, a switching stage and a load stage. The inputting stage includes a switching pair and a transconductance circuit. The load stage is formed by resistors. The switching stage includes a switch quad (two switch pairs). Each switch pair of the switching stage has a current source for implementation of current injection to a common source (emitter) junction of the switch pair. For each switch pair of the switching stage, an inductor is connected between the current source and the common source (emitter) junction. In addition, a capacitor is connected with the inductor.

16 Claims, 6 Drawing Sheets

LOW NOISE MIXER WITH REDUCED DISTORTION

TECHNICAL FIELD OF THE INVENTION

The present invention relates to a mixer, more particularly, to an RF mixer suitable for use in high-frequency wireless communication applications, such as a direct conversion receiver operating in the order of GHz.

BACKGROUND OF THE INVENTION

A direct conversion technique is very suitable for high data rate applications, and therefore the technique is now widely used, such as a direct conversion receiver. In the direct conversion receiver, a mixer plays a very important role. The mixer converts an RF signal into an intermediate frequency (IF) or baseband signal. However, the mixer may induce noise into the receiver, so that the noise figure of the receiver is degraded. In addition, linearity of the mixer affects the dynamic range of the receiver. Therefore, various mixer structures are proposed in order to achieve desirable noise figure as well as linearity.

FIG. 1 shows a structure of a conventional Gilber mixer 100. The mixer 100 includes an inputting stage having a switch pair (transistors 112, 114) and a transconductance circuit comprising degeneration resistors 126, 128 and a current source 130, a switching stage having a switch quad (transistors 142, 144, 146 and 148), and a load stage having resistors 156 and 158. In this example, the transistors are implemented by CMOS transistors.

In the inputting stage, the gates of the transistors 112 and 114 are connected to an RF signal source 106. One terminal of the degeneration resistor 126 is connected with the source of the transistor 112, and one terminal of the degeneration resistor 128 is connected with the source of the transistor 114. The other terminals of the degeneration resistors 126 and 128 are connected together and connected to ground via the current source 130. The drains of the transistors 112 and 114 are connected to the switching stage.

In the switching stage, the gates of the pair of transistors 142, 144, and the gates of the pair of transistors 146, 148 are connected to a local oscillation signal source 108. The transistors 142 and 144 have the sources thereof connected together and connected with the drain of the transistor 112. The transistors 146 and 148 have the sources thereof connected together and connected with the drain of the transistor 114. The drains of the transistors 142 and 146 are connected together as an output port and connected to the resistor 156. The drains of the transistors 144 and 148 are connected together as the other output port and connected to the resistor 158.

An RF signal is input to the inputting stage of the mixer 100 from the RF signal source 106, and is down-converted by the switching stage with a local oscillation signal provided by the local oscillation signal source 108, and then the down-converted signal is outputted via the output ports.

In this structure, the degeneration resistors 126 and 128 are used to improve the linearity of the mixer 100. The current passed by the current source 130 is divided between the transistors 112 and 114. The degeneration resistors 126 and 128 increase a maximum useful input voltage for the mixer and set an effective transconductance for the mixer.

However, such a structure has a disadvantage of a conflict between noise figure and linearity. If the current and the resistance of the degeneration resistors are decreased, the noise is reduced but the distortion is increased. Conversely, if the current and the resistance are increased, the distortion is reduced but the noise is increased.

Therefore, there is a need for a mixer which may provide qualified linearity, in the meanwhile, noise is depressed.

SUMMERY OF THE INVENTION

The present invention is to provide an improved low noise RF mixer. The mixer of the present invention has an excellent linearity due to reduction of a second-order distortion.

In accordance with one aspect of the present invention, the mixer basically has a Gilber mixer structure. The mixer comprises an inputting stage, a switching stage and a load stage. The inputting stage includes a transistor pair and a transconductance circuit. The load stage is formed by resistors. The switching stage includes a switch quad (two switch pairs). Each switch pair of the switching stage has a current source for implementation of current injection. In an embodiment, in which transistors used in the mixer are CMOS transistors, the current source injects a current to a common source junction of the switch pair.

For each switch pair of the switching stage, an inductor is connected between the current source and the common source junction. In addition, a capacitor is connected with the inductor.

The inductor neutralizes the effect of parasitic capacitance induced at the common source junction of each switch pair of the switching stage. Accordingly, the second-order distortion mainly due the parasitic capacitance is significantly reduced.

BRIEF DESCRIPTION OF THE DRAWINGS

The present invention will be further described in details in conjunction with the accompanying drawings. In the drawings, the like reference numbers indicate the similar elements.

DETAILED DESCRIPTION OF THE INVENTION

To improve the noise figure of the mixer, a method of current injection was proposed.

Figure 1:
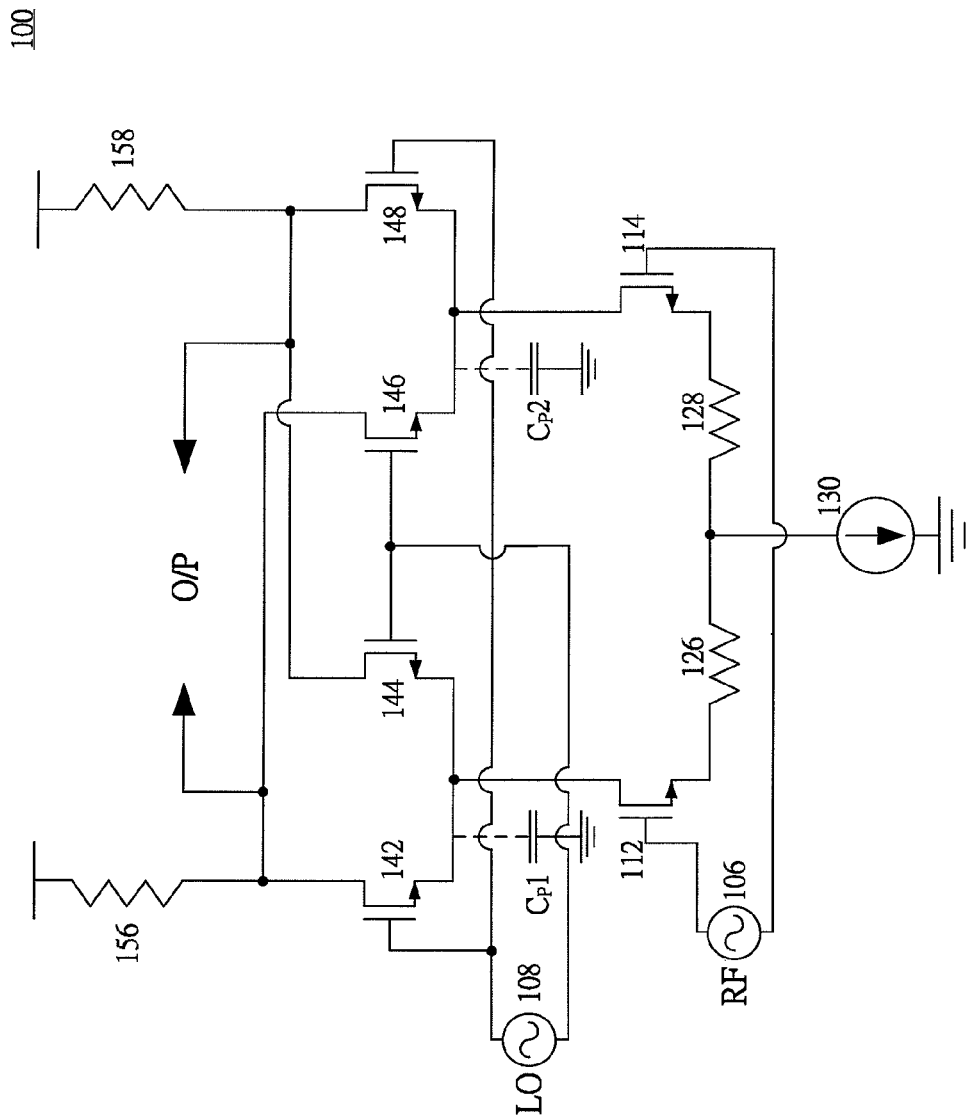
FIG. 1 schematically shows a circuit structure of a conventional Gilber mixer with a transconductance circuit.
Figure 2:
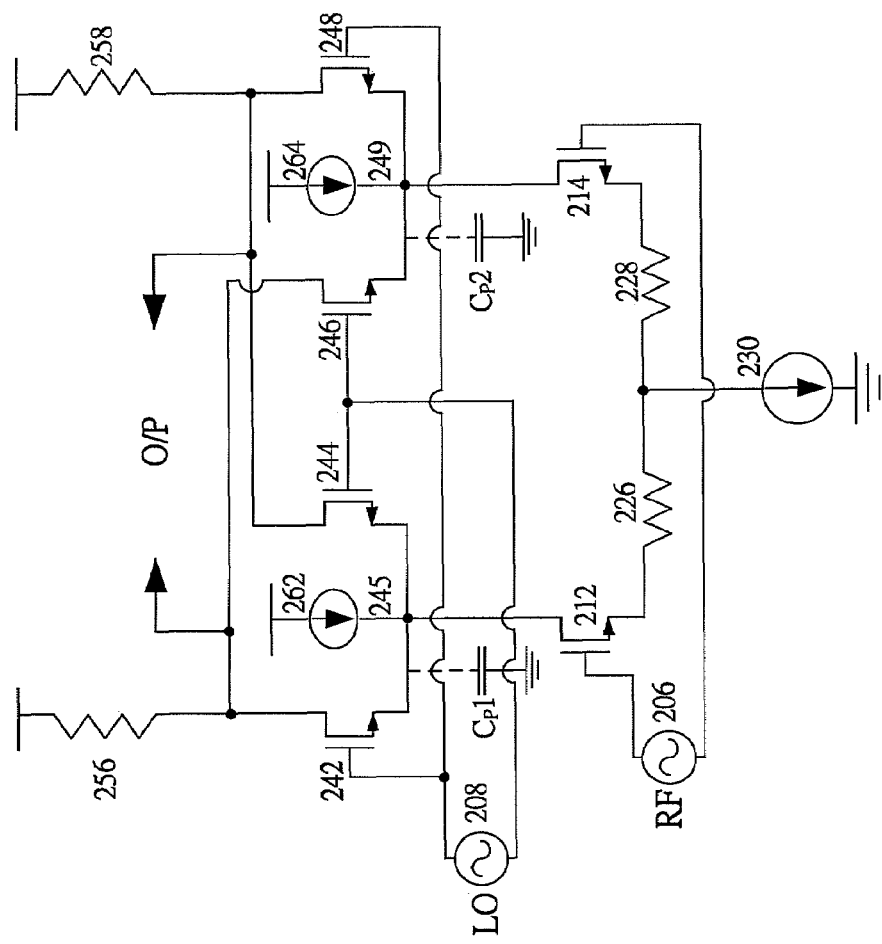
FIG. 2 schematically shows a circuit structure of a Gilber mixer with a transconductance circuit and additional current injection.

FIG. 2 shows a structure of a mixer 200. The mixer 200 is similar to the mixer 100 in FIG. 1, however, the mixer 200 is further provided with additional current injection. As shown, mixer 200 includes an inputting stage having a switch pair (transistors 212, 214) and a transconductance circuit consisting of degeneration resistors 226, 228 and a current source 230, a switching stage having two switch pairs (transistors 242, 244, and 246, 248), and a load stage constructed by resistors 256 and 258. The inputting stage is connected with an RF signal source 206, and the switching stage is connected with a local oscillation signal source 208.

In this example, the transistors are implemented by CMOS transistors.

The elements mentioned above and connections thereof in the mixer 200 are similar to those of the mixer 100, and therefore the descriptions thereof are omitted to avoid redundancy.

The difference between the mixer 200 of FIG. 2 and the mixer 100 of FIG. 1 is that the mixer 200 further includes two current sources 262 and 264 added to the switching stage. As shown in the drawing, the current source 262 is connected to the common source junction 245 of the pair of transistors 242 and 244, and the current source 264 is connected to the common source junction 249 of the pair of transistors 246 and 248.

By adding the current sources 262 and 264, the currents flowing through the switch pairs of the switching stage decrease, so that the noise is reduced. Accordingly, the noise figure of the mixer 200 is improved.

Especially in high frequency applications, parasitic capacitances (indicated by "$C_P1$" "$C_P2$" in the drawings) induced on the common source junctions in the switching stage contribute a lot to intermodulation, which cause even-order distortion and in turn affect the linearity of the mixer. The addition of the current sources at the common source junctions increases the parasitic capacitances introduced in the switching stage. Accordingly, the linearity of the mixer is influenced.

Figure 3:
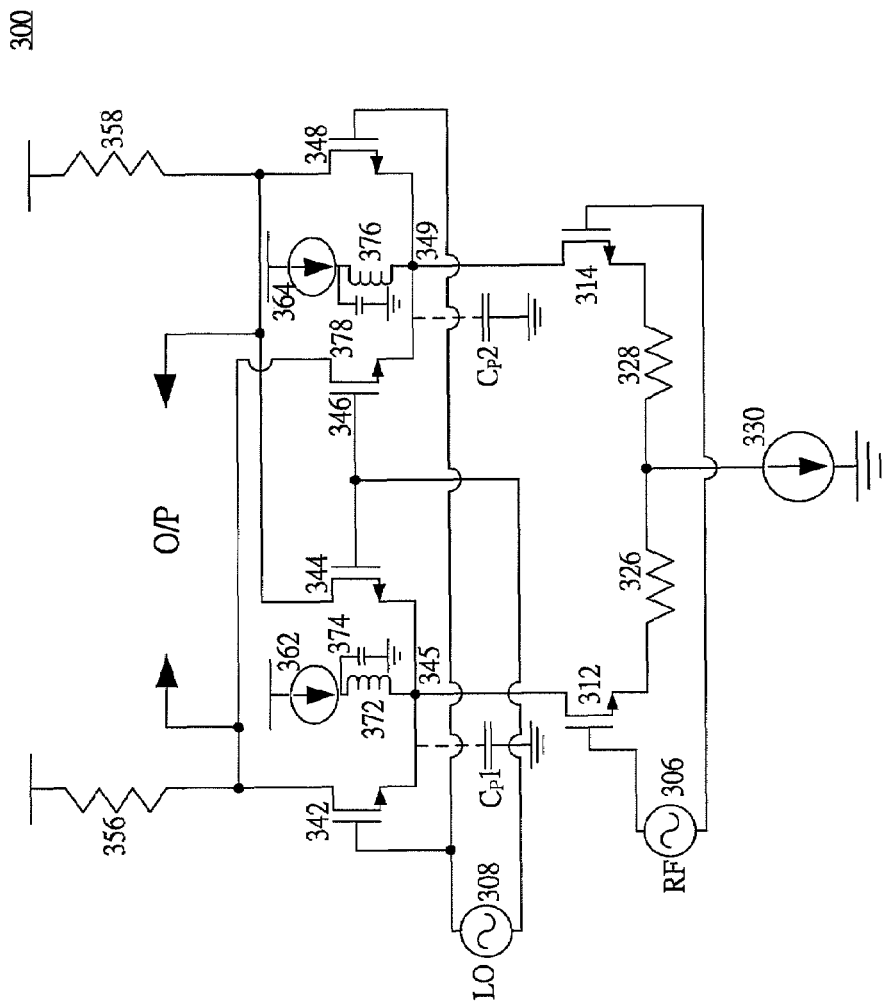
FIG. 3 schematically illustrates an embodiment of a mixer in accordance with the present invention.

FIG. 3 schematically illustrates a structure of a mixer 300 in an embodiment according to the present invention. As shown, the mixer 300 includes an inputting stage having a switch pair consisting of transistors 312, 314 and a transconductance circuit. In this embodiment, the transconductance circuit comprises two degeneration resistors 326, 328 and a current source 330. The mixer 300 further has a switching stage comprising two switch pairs, they are, transistors 342, 344, and transistors 346, 348. In addition, the mixer 300 includes a load stage formed with resistors 356 and 358.

In the inputting stage of the mixer 300, the gates of the transistors 312 and 314 are connected to a first signal source, such as an RF signal source 306. One terminal of the degeneration resistor 326 is connected with the source of the transistor 312, and one terminal of the degeneration resistor 328 is connected with the source of the transistor 314. The other terminals of the degeneration resistors 326 and 328 are connected together and connected to ground via the current source 330. The drains of the transistors 312 and 314 are connected to the switching stage.

In the switching stage of the mixer 300, the gates of the pair of transistors 342, 344, and the gates of the pair of transistors 346, 348 are respectively connected to a second signal source, such as a local oscillation (LO) signal source 308. The transistors 342 and 344 have the sources thereof connected together as a first (common source) junction 345. The drain of the transistor 312 of the inputting stage is connected to the common source junction 345. The transistors 346 and 348 have the sources thereof connected together as a second (common source) junction 349. The drain of the transistor 314 is connected to the common source junction 349. The drains of the transistors 342 and 346 are connected together as an output port and connected to the resistor 356 of the load stage. The drains of the transistors 344 and 348 are connected together as the other output port and connected to the resistor 358 of the load stage.

An RF signal is inputted to the gates of the transistors 312, 314 of the inputting stage from the RF signal source 306. Then the signal is down-converted by the switching stage with a local oscillation signal fed to the gates of the transistors 342, 344, 346 and 348. The local oscillation signal is provided by the local oscillation signal source 308. Then the down-converted signal is outputted via the output ports.

In the mixer 300, current injections are provided at the common source junctions 345 and 349 by current sources 362 and 364. However, the current sources 362 and 364 are not directly connected to the common source junction node 345 of the transistors 342, 344, and the common source junction node 349 of the transistors 346 and 348, respectively. Instead, an inductive element, such as an inductor 372 is connected between the current source 362 and the common source junction 345. The inductor 372 has a first terminal thereof connected with the current source 362, and a second terminal thereof connected to the common source junction 345. The first terminal of the inductor 372 is further connected to ground via a capacitive element, such as a capacitor 374, so that inductor 372 may take effect. Similarly, an inductor 376 is connected between the current source 364 and the common source junction 349. The inductor 376 has a first terminal thereof connected with the current source 364, and a second terminal thereof connected to the common source junction 349. The first terminal of the inductor 374 is further connected to ground via a capacitive element, such as a capacitor 378.

The inductor 372 is selected so that the inductance thereof is large enough to neutralize the effects of the parasitic capacitance $C_P1$ and the capacitor 374. Since the parasitic capacitance $C_P1$ can be obtained, and the capacitance of the capacitor 374 is known, the required inductance can be determined. Accordingly, the inductor 372 can be properly selected. Similarly, the inductor 376 is selected so that the inductance thereof is large enough to neutralize the effects of the parasitic capacitance $C_P2$ and the capacitor 378.

Ideally, the mixer 300 is a balanced structure. The parasitic capacitances $C_P1$ and $C_P2$ are substantially equivalent to each other. Accordingly, it is preferred that the inductances of the inductors 372 and 376 are substantially the same. Also, the capacitances of the capacitors 374 and 378 are substantially the same.

The resonance frequency of the parasitic capacitances $C_P1$, $C_P2$, the inductors 372, 376 and the capacitors 374, 378 can be determined by selecting the inductors 372, 376 and the capacitors 374, 378. Accordingly, the mixer 300 may operate well at a predetermined frequency band as desired.

By adding the inductors 372 and 376, the affects of the parasitic capacitances induced at the common source junctions of the switching stage can be substantially canceled. Accordingly, the second-order distortion is significantly reduced, thereby the linearity of the mixer 300 is improved.

As previously mentioned, the affect of the parasitic capacitance becomes significantly serious when the mixer is operating at a high frequency, such as the order of Giga hertz. Thus, the mixer in accordance with the present invention is especially advantageous for high frequency applications.

Figure 4:
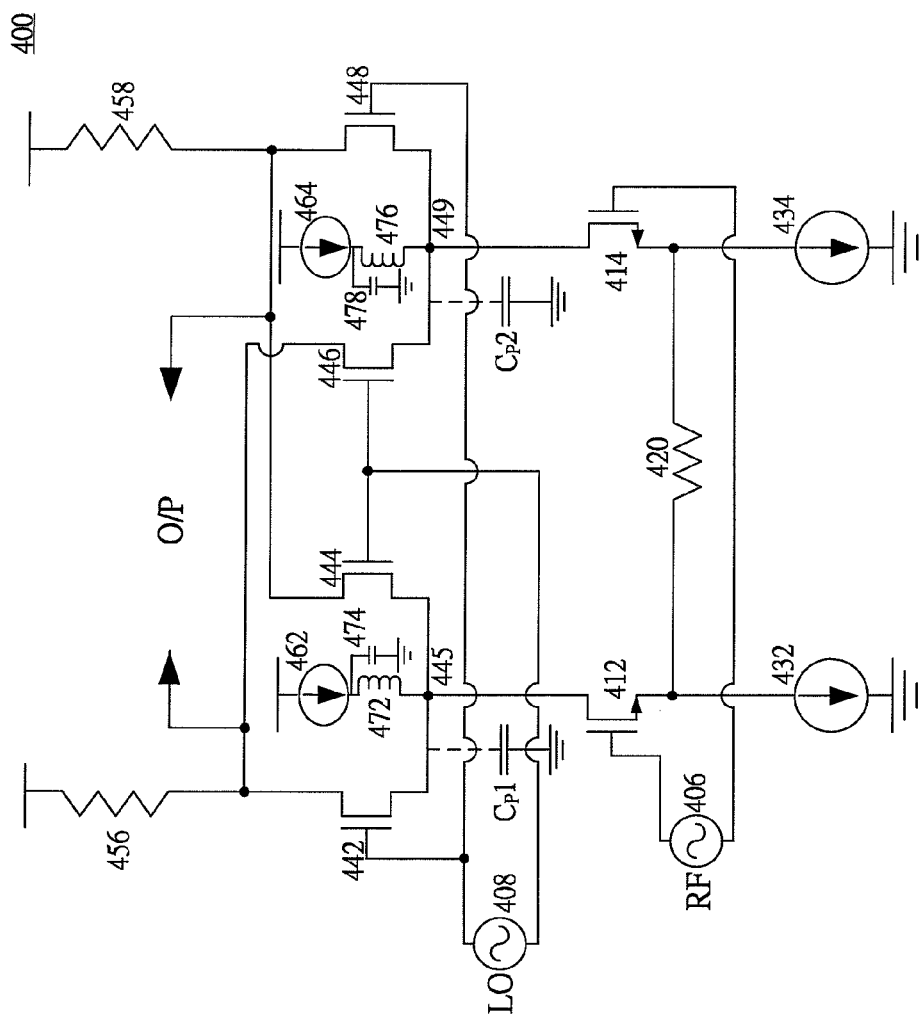
FIG. 4 schematically illustrates another embodiment of the mixer in accordance with the present invention.

FIG. 4 shows another embodiment in accordance with the present invention. In this drawing, a mixer 400 includes an inputting stage connected with an RF signal source 406. The inputting stage has a switch pair consisting of transistors 412, 414 and a transconductance circuit. In this embodiment, the transconductance circuit includes a degeneration resistor 420 and two current sources. The degeneration resistor 420 is connected with the sources of the transistors 412 and 414 in between. The current source 432 is connected between the source of the transistor 412 and ground. The current source 434 is connected between the source of the transistor 414 and ground.

The mixer 400 further has a switching stage connected with a local oscillation (LO) signal source 408. The switching stage comprises two switch pairs, that is, transistors 442, 444, and transistors 446, 448. A current source 462 is connected to a common source junction 445 of the transistors 442, 444 via an inductor 472. A capacitor 474 is connected between the connection of the inductor 472 with the current source 462 and ground. Similarly, a current source 464 is connected to a common source junction 449 of the transistors 446, 448 via an inductor 476. A capacitor 478 is connected between the connection of the inductor 476 with the current source 464 and ground.

In addition, the mixer 400 includes a load stage formed with resistors 456 and 458.

The switching stage and the load stage of the mixer 400 are the same as the mixer 300, therefore the relevant descriptions are omitted herein.

Figure 5:
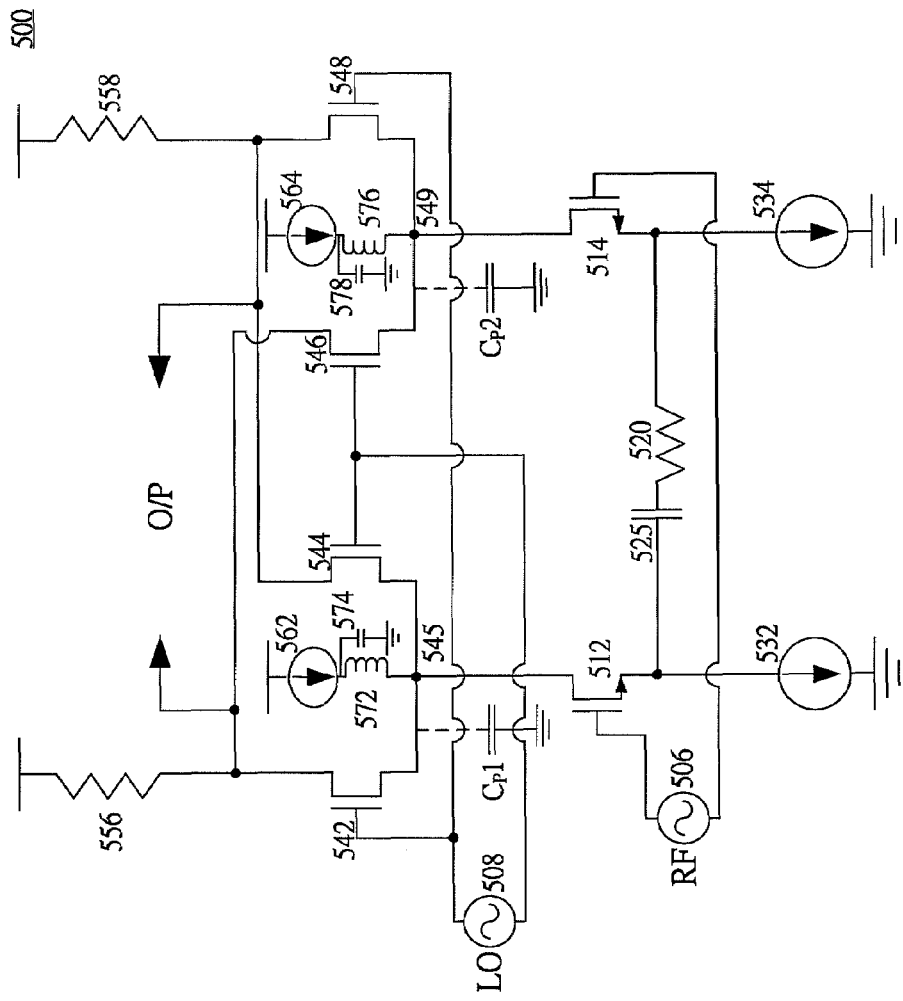
FIG. 5 schematically illustrates a further embodiment of the mixer in accordance with the present invention.

FIG. 5 shows a further embodiment in accordance with the present invention. In this drawing, a mixer 500 includes an inputting stage connected with an RF signal source 506. The inputting stage has a switch pair consisting of transistors 512, 514 and a transconductance circuit. In the present embodiment, the transconductance circuit has a degeneration resistor 520, a capacitor 525 and two current sources. The degeneration resistor 520 and the capacitor 525 are connected in series and connected with the sources of the transistors 512 and 514 in between. The current source 532 is connected between the source of the transistor 512 and ground. The current source 534 is connected between the source of the transistor 514 and ground.

The mixer 500 further has a switching stage connected with a local oscillation signal source 508. The switching stage comprises two switch pairs, transistors 542, 544, and transistors 546, 548. A current source 562 is connected to a common source junction 545 of the transistors 542, 544 via an inductor 572. A capacitor 574 is connected between the connection of the inductor 572 with the current source 562 and ground. Similarly, a current source 564 is connected to a common source junction 549 of the transistors 546, 548 via an inductor 576. A capacitor 578 is connected between the connection of the inductor 576 with the current source 564 and ground.

In addition, the mixer 500 includes a load stage formed with resistors 556 and 558.

The switching stage and the load stage of the mixer 500 are the same as the mixer 300, therefore the relevant descriptions are omitted herein.

Figure 6:
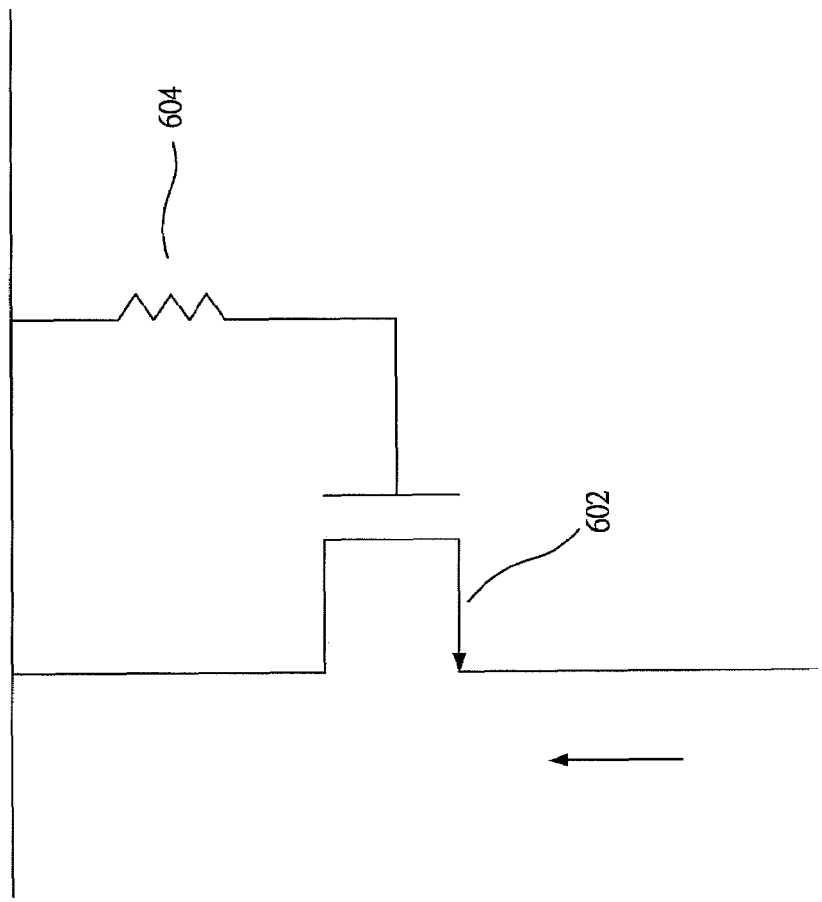
FIG. 6 illustrates an implementation of structure which is capable of providing inductive impedance at certain frequencies.

In the above embodiments, the portion providing the required inductive impedance to cancellation the parasitic capacitance includes a current source (362, 462, 562), an inductor (372, 472, 572) as well as a capacitor (374, 474, 574). However, such a portion can be implemented in another manner. FIG. 6 illustrates another implementation of the portion providing the inductive impedance. As shown, a transistor 602 has a drain thereof coupled with one terminal of a resistor 604, and a gate thereof connected with the other terminal of the resistor 604. An output impedance of this structure looked from the output port (a source of the transistor 602) will appear as inductive impedance at specific frequencies. Therefore, such a structure can also be utilized to provide the required inductive impedance at certain frequency applications.

In these embodiments, the transistors are implemented by CMOS transistors. However, the transistors can also be implemented by bipolar junction transistors (BJTs) or any other suitable types of transistors.

While the preferred embodiment of the present invention has been illustrated and described in details, various modifications and alterations can be made by persons skilled in this art. The embodiment of the present invention is therefore described in an illustrative but not in a restrictive sense. It is intended that the present invention should not be limited to the particular forms as illustrated, and that all modifications and alterations which maintain the spirit and realm of the present invention are within the scope as defined in the appended claims.

What is claimed is:

1. A mixer comprising:
    an inputting stage connected to a first signal source; and
    a switching stage including a first and second switch pairs, the first switch pair having a first and second transistors, and the second switch pair having a third and fourth transistors, first terminals of the first, second, third and fourth transistors being connected to a second signal source, second terminals of the first and second transistors being connected together as a first junction, second terminals of the third and fourth transistors being connected together as a second junction, the first and second junctions being directly connected to the inputting stage, and third terminals of the first and third transistors being connected together as an output port, and third terminals of second and fourth transistors being connected together as another output port, the switching stage further including a first inductive element connected to the first junction, a first current source connected with the first inductive element, and a first capacitive element connected between the first inductive element and ground, a second inductive element connected to the second junction, a second current source connected with the second inductive element, and a second capacitive element connected between the second inductive element and ground,
    wherein an inductive impedance of the first inductive element is sufficient to substantially cancel a parasitic capacitance induced at the first switch pair and capacitance of the first capacitor, and an inductive impedance of the second inductive element is sufficient to substantially cancel a parasitic capacitance induced at the second switch pair and capacitance of the second capacitor.

2. The mixer as claimed in claim 1, wherein the inputting stage comprises a third switch pair and a transconductance circuit, the third switch pair includes a fifth and sixth transistors having first terminals thereof connected to the first signal source, second terminals thereof connected with each other through the transconductance circuit and connected to ground.

3. The mixer as claimed in claim 2, wherein the transconductance circuit comprises a first resistive element, a second resistive element and a third current source, a first terminal of the first resistive element is connected to the second terminal of the fifth transistor, and a first terminal of the second resistive element is connected to the second terminal of the sixth transistor, second terminals of the first and second resistive elements are connected together and connected to ground via the third current source.

4. The mixer as claimed in claim 2, wherein the transconductance circuit comprises a third resistive element and a fourth and fifth current sources, the third resistive element is connected between the second terminals of the fifth and sixth transistors, and the fourth and fifth current sources are connected between the second terminals of the fifth, sixth transistors and ground, respectively.

5. The mixer as claimed in claim 4, wherein the transconductance circuit further comprises a third capacitive element, the third capacitive element and the third resistive element are connected in series between the second terminals of the fifth and sixth transistors.

6. A mixer comprising:
a current source coupled to a node through a first path, the current source having an inductive output impedance; and
a switch pair comprising:
  a first transistor coupled to the node, the first transistor comprising a first control terminal; and
  a second transistor coupled to the node, the second transistor comprising a second control terminal, wherein a parasitic capacitance is induced between the node and a substrate of the mixer, and the inductive output impedance substantially cancels the parasitic capacitance;
wherein the switch pair receives a first signal through the first and the second control terminals, the switch pair receives a second signal through a second path, and the mixer performs a mixing operation on the first and the second signals.

7. The mixer as claimed in claim 6, further comprising an input stage connected to the node.

8. The mixer as claimed in claim 6, further comprising a load stage, and wherein the first and second transistors are connected between the node and the load stage.

9. A mixer comprising:
a current source;
an inductive element coupled between the current source and a node through a first path; and
a switch pair comprising:
  a first transistor coupled to the node, the first transistor having a first control terminal; and
  a second transistor coupled to the node, the first transistor having a first control terminal,
wherein the switch pair receives a first signal through the first and the second control terminals, the switch pair receives a second signal through a second path, the mixer performs a mixing operation on the first and the second signals, and an inductive impedance of the inductive element is sufficient to substantially cancel a parasitic capacitance induced at the switch pair.

10. The mixer as claimed in claim 9, further comprising an input stage connected to the node.

11. The mixer as claimed in claim 9, further comprising a load stage, and wherein the first and second transistors are connected between the node and the load stage.

12. The mixer as claimed in claim 9, wherein the inductive element comprises an inductor.

13. The mixer as claimed in claim 9, wherein the inductive element comprises a transistor.

14. A method for reducing noise of a mixing operation, the method comprising:
providing a switch pair, the switching pair comprising a first transistor having a first control terminal and a second transistor having a second control terminal, the first and second transistors being coupled to a node, the switch pair receiving a first signal through the first and second control terminals, receiving a second signal through a first path so that the mixer performs a mixing operation on the first and second signals;
providing an inductive element connected to the node on a second signal path, the inductive element having inductive impedance being sufficient to substantially cancel a parasitic capacitance induced at the switch pair; and
injecting a current through the inductive element to the node.

15. The method as claimed in claim 14 wherein the inductive element comprises an inductor.

16. The method as claimed in claim 14, wherein the inductive element comprises a transistor.

* * * * *